(12) United States Patent
Yamamoto et al.

(10) Patent No.: US 6,387,969 B1
(45) Date of Patent: May 14, 2002

(54) POROUS ARTICLE AND PROCESS FOR PRODUCING POROUS ARTICLE

(75) Inventors: Takayuki Yamamoto; Amane Mochizuki; Takahiro Fukuoka; Tomohiro Taruno; Mitsuhiro Kanada, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/655,441

(22) Filed: Sep. 5, 2000

(30) Foreign Application Priority Data

Sep. 16, 1999 (JP) ............................................. 11-262793

(51) Int. Cl.$^7$ ................. C08J 9/26; C08J 9/28
(52) U.S. Cl. ............................. 521/61; 521/62; 521/77; 521/134
(58) Field of Search .............................. 521/62, 61, 77, 521/134, 135, 136, 137, 138, 139, 140

(56) References Cited

U.S. PATENT DOCUMENTS

| | | | | |
|---|---|---|---|---|
| 4,201,820 A | * | 5/1980 | Johnson | 428/195 |
| 4,535,100 A | | 8/1985 | Krutchen et al. | 521/180 |
| 4,868,222 A | * | 9/1989 | Chau et al. | 521/61 |
| 4,873,218 A | | 10/1989 | Pekala | |
| 5,081,163 A | * | 1/1992 | Pekala | 521/187 |
| 5,776,990 A | | 7/1998 | Hedrick et al. | |
| 5,789,338 A | * | 8/1998 | Kachmitter et al. | 502/418 |

FOREIGN PATENT DOCUMENTS

| | | | | |
|---|---|---|---|---|
| JP | 6-322168 | 11/1994 | ............... | C08J/9/12 |
| JP | 9-100363 | 4/1997 | ............... | C08J/9/04 |
| JP | 10-45936 | 2/1998 | ............... | C08J/9/12 |

OTHER PUBLICATIONS

S. Jayaraman et al; High Tg Polyimide Nanofoams Derived From Pyromellitic Dianhydride And 1,1–Bis(4–Aminophenyl)–1–1pHenyl–2,2,2–Trifluromethane; 1994; pp. 347 and 348.

E. Lebedeva et al; Preparation of Porous Polymides From Self–Assembled Graft Copolymers; 1999; pp. 494 and 495.

European Search Report.

* cited by examiner

*Primary Examiner*—James J. Seidleck
*Assistant Examiner*—Melanie D. Bagwell
(74) *Attorney, Agent, or Firm*—Sughrue Mion, PLLC

(57) ABSTRACT

A porous article having excellent heat resistance, a finely cellular structure, and a low dielectric constant; and a process for producing the porous article which comprises subjecting a polymer composition having a micro-domain structure comprising a continuous polymer phase and dispersed therein a discontinuous phase having an average diameter smaller than 10 μm to a treatment for removing the ingredient constituting the discontinuous phase by at least one operation selected from vaporization and decomposition and by an extraction operation to thereby make the polymer porous. The ingredient constituting the discontinuous phase has a weight average molecular weight of, e.g., 10,000 or lower. Liquefied carbon dioxide, supercritical carbon dioxide, or the like can be used as an extraction solvent for the ingredient constituting the discontinuous phase.

3 Claims, 1 Drawing Sheet

POROUS ARTICLE AND PROCESS FOR PRODUCING POROUS ARTICLE

FIELD OF THE INVENTION

The present invention relates to a heat-resistant porous article having fine cells and a low dielectric constant and to a process for producing the same. This porous article is highly useful as, for example, a circuit substrate for electronic appliances, etc.

BACKGROUND OF THE INVENTION

Because of their high insulating properties, plastic films have conventionally been utilized as parts or members required to have reliability, such as circuit substrates and substrates for printed wiring boards, in electronic/electrical appliances, electronic parts, etc. In the field of electronic appliances where a large quantity of information is stored and is processed and transmitted at a high speed so as to cope with the recent highly information-oriented society, plastic materials for use therein are also required to have higher performances. In particular, a lower dielectric constant and a smaller dielectric loss tangent are desired as electrical properties necessary for the use of higher frequencies.

The dielectric constant of a plastic material is generally determined by the molecular structure thereof. This means that a technique which may be effective in reducing dielectric constant is to modify a molecular structure. However, in view of the fact that polyethylene and polytetrafluoroethylene, which are regarded as low dielectric constant-polymers, have dielectric constants of about 2.3 and about 2.1, respectively, there are limitations in the technique of controlling dielectric constant based on structure modifications.

There is another attempt to reduce dielectric constant by making a plastic material porous to thereby control the dielectric constant of the material based on the porosity thereof so as to take advantage of the dielectric constant of air, which is 1. Various proposals have been made on this technique.

Known common processes conventionally used for producing a porous article include dry processes and wet processes, and the dry processes include a physical process and a chemical process. The general physical process comprises dispersing a low-boiling liquid (foaming agent) such as a chlorofluorocarbon or hydrocarbon into a polymer and then heating the polymer to volatilize the foaming agent and thereby form cells. The chemical process for obtaining a foam comprises adding a compound (foaming agent) to a polymer base and pyrolyzing the compound to generate a gas and thereby form cells.

For example, U.S. Pat. No. 4,532,263 discloses a method for obtaining a foamed polyetherimide or the like using methylene chloride, chloroform, trichloroethane or the like as a foaming agent. However, this foaming technique has various environmental problems such as the harmfulness of the substances used as foaming agents and ozonosphere depletion. In addition, it is difficult to obtain with this technique a foam having fine cells uniform in diameter, although the technique is generally suitable for obtaining a foam having a cell diameter of tens of micrometers or larger. On the other hand, the latter foaming technique, which is a chemical process, has a drawback that a residue of the foaming agent which has generated a gas remains in the resulting foam. Such corrosive gases and impurities pose a problem concerning pollution especially in applications such as electronic parts, where pollution reduction is highly required.

Recently, a technique for obtaining a foam having a small cell diameter and a high cell density has been proposed. This technique comprises dissolving a gas such as nitrogen or carbon dioxide in a polymer at high pressure, subsequently releasing the polymer from the pressure, and heating the polymer to around the glass transition temperature or softening point thereof to thereby form cells. This foaming technique, in which cells are formed by forming nuclei from the gas in a thermodynamically unstable state and then expanding and growing the nuclei, has an advantage that a foam having microporosity which has been unobtainable so far can be obtained.

JP-A-6-322168 (the term "JP-A" as used herein means an "unexamined published Japanese patent application") proposes a process for producing a heat-resistant foam by applying any of those techniques to a polyetherimide as a thermoplastic polymer. However, this process has the following drawback. When a polymer is impregnated with a high-pressure gas in a pressure vessel, the pressure vessel is heated to or around the Vicat softening point of the polymer. Because of this heating, the polymer is in a molten state during pressure reduction and, hence, the high-pressure gas readily expands. As a result, the foam obtained has a cell size as large as from 10 to 300 $\mu$m. Consequently, this foam, when used as a circuit substrate, needs to have a large thickness and imposes limits on the formation of finer patterns.

On the other hand, JP-A-10-45936 proposes a technique of forming a foamed molding having closed cells with a cell size of from 0.1 to 20 $\mu$m by likewise applying any of those techniques to a styrene resin having a syndiotactic structure, and further proposes use of the foamed molding as an electric circuit member. However, since styrene resins having a syndiotactic structure generally have a glass transition point around 100° C., this foamed molding deforms or bends when used at temperatures of 100° C. or higher. Consequently, this foamed molding is usable only in a limited range of applications.

Furthermore, JP-A-9-100363 proposes a low dielectric constant insulating plastic film characterized by comprising a porous plastic having a porosity of 10 vol % or higher likewise obtained using carbon dioxide or another substance as a foaming agent and by having a heat resistance temperature of 100° C. or higher and a dielectric constant of 2.5 or lower. Although there is a description therein to the effect that an average pore size of 10 $\mu$m or smaller is obtainable, the actually attainable minimum cell size is about 5 $\mu$m at the most as far as the disclosure therein is viewed. It is therefore expected that there are limits on the formation of finer patterns.

SUMMARY OF THE INVENTION

Accordingly, one object of the present invention is to provide a porous article which not only has excellent heat resistance and a finely cellular structure but has a low dielectric constant.

Another object of the present invention is to provide a process for producing the porous article.

As a result of extensive investigations to overcome the conventional problems described above, it has been found that when an additive is added to a heat-resistant polymer such as a polyimide to form a specific micro-domain structure and is then removed therefrom by heating and solvent extraction while utilizing differences between the two ingredients in volatility (boiling point) or thermal decomposability and in solubility in a solvent, a porous article having extremely fine cells and a low dielectric constant is obtained. The present invention has been completed based on this finding.

The invention provides a process for producing a porous article which comprises subjecting a polymer composition having a micro-domain structure comprising a continuous polymer phase and dispersed therein a discontinuous phase having an average diameter smaller than 10 μm to a treatment for removing an ingredient constituting the discontinuous phase by at least one operation selected from vaporization and decomposition and by an extraction operation to thereby make the polymer porous.

The ingredient constituting the discontinuous phase has a weight average molecular weight of, for example, 10,000 or lower. Liquefied carbon dioxide or supercritical carbon dioxide can be used as an extraction solvent for the ingredient constituting the discontinuous phase.

The invention further provides a porous article which comprises a heat-resistant polymer and has an average cell diameter smaller than 5 μm and a dielectric constant of 3 or lower.

DETAILED DESCRIPTION OF THE INVENTION

Figure 1:
FIG. 1 is a scanning electron photomicrograph showing the structure of a section of the porous film obtained in Example 1.
Figure 2:
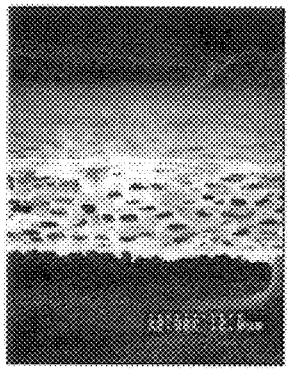
FIG. 2 is a scanning electron photomicrograph showing the structure of a section of the porous film obtained in Example 2.
Figure 3:
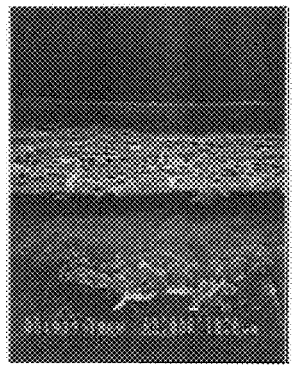
FIG. 3 is a scanning electron photomicrograph showing the structure of a section of the porous film obtained in Example 3.
Figure 4:
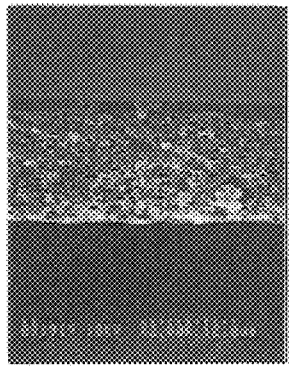
FIG. 4 is a scanning electron photomicrograph showing the structure of a section of the porous film obtained in Example 4.
Figure 5:
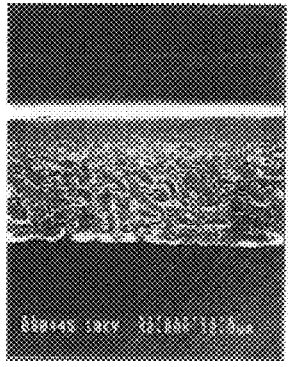
FIG. 5 is a scanning electron photomicrograph showing the structure of a section of the porous film obtained in Example 5.
Figure 6:
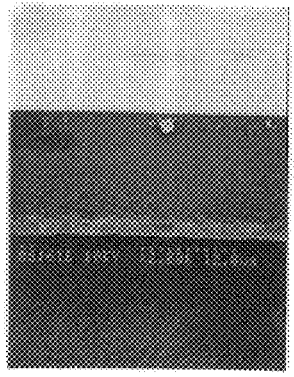
FIG. 6 is a scanning electron photomicrograph showing the structure of a section of the film obtained in Comparative Example 1.

The polymer used as the base of the porous article of the invention, i.e., the polymer constituting the continuous phase in the polymer composition having a micro-domain structure, is not particularly limited and can be any polymer having heat resistance. Examples of the polymer include polyamides, polycarbonates, poly(butylene terephthalate), poly(ethylene terephthalate), poly(phenylene sulfide), polysulfones, polyethersulfones, polyetheretherketones, poly(amide-imide)s, polyimides, and polyetherimides. However, the base polymer should not be construed as being limited to those examples. Such polymers can be used alone or as a mixture of two or more thereof.

Especially preferred among those polymers are polyimides and polyetherimides. Polyimides can be obtained by known or common methods. For example, a polyimide can be obtained by reacting an organic tetracarboxylic dianhydride with a diamino compound (diamine) to synthesize a polyimide precursor (poly(amic acid)) and subjecting this polyimide precursor to dehydrating ring closure.

Examples of the organic tetracarboxylic dianhydride include pyromellitic dianhydride, 3,3',4,4'-biphenyltetracarboxylic dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl) ether dianhydride, and bis(3,4-dicarboxyphenyl) sulfone dianhydride. These organic tetracarboxylic dianhydrides may be used alone or as a mixture of two or more thereof.

Examples of the diamino compound include m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2'-dimethylbiphenyl, and 2,2-bis(trifluoromethyl)-4,4'-diaminobiphenyl.

The polyimide precursor is obtained by reacting an organic tetracarboxylic dianhydride with a diamino compound (diamine) in a nearly equimolar proportion generally in an organic solvent at from 0 to 90° C. for from about 1 to 24 hours. Examples of the organic solvent include polar solvents such as N-methyl-2-pyrrolidone, N,N-dimethylacetamide, N,N-dimethylformamide, and dimethyl sulfoxide.

The dehydrating ring closure reaction of the polyimide precursor is conducted by, for example, heating the precursor at from about 300 to 400° C. or by causing a dehydrating agent, e.g., a mixture of acetic anhydride and pyridine, to act on the precursor. In general, polyimides are polymers insoluble in organic solvents and difficult to mold. Because of this, the polyimide precursor is generally used in preparing a polymer composition having the micro-domain structure in the production of a porous article comprising a polyimide.

Besides being obtained by the method described above, polyimides can also be obtained by a method comprising reacting an organic tetracarboxylic dianhydride with an N-silylated diamine to obtain a poly(amic acid) silyl ester and heating the ester to cause it to undergo ring closure.

Although polyetherimides also can be obtained by commonly used methods, commercial products thereof may be used, such as Ulthem resins (manufactured by General Electric Co.) and Superio resins (manufactured by Mitsubishi Plastics Industries Ltd.).

In the present invention, the ingredient constituting the discontinuous phase in the micro-domain structure (hereinafter sometimes referred to as an "additive" for simplicity) is not particularly limited as long as it is an ingredient which, when mixed with the heat-resistant polymer, is capable of forming a micro-domain structure and which undergoes either volatilization (vaporization) or decomposition into, e.g., carbon upon heating and can be extracted with a solvent.

Examples of such an ingredient include polyalkylene glycols such as polyethylene glycol and polypropylene glycol; those polyalkylene glycols terminated at one or each end by methyl or terminated at one or each end by (meth) acrylate; urethane prepolymers; and (meth)acrylate compounds such as phenoxypolyethylene glycol (meth)acrylate, ∈-caprolactone (meth)acrylate, trimethylolpropane tri(meth)acrylate, dipentaerythritol hexa(meth)acrylate, urethane (meth)acrylates, epoxy (meth)acrylates, and oligoester (meth)acrylates. Those can be used alone or in combination of two or more thereof.

The additive described above is not particularly limited in molecular weight. However, it preferably has a weight average molecular weight of 10,000 or lower (e.g., about 100 to 10,000), more preferably about 200 to 3,000, because such a molecular weight enables the later removal operations to be conducted easily. An oligomer is frequently used as the additive.

The polymer composition having a micro-domain structure in the invention can be formed by applying a common or known technique. For example, a combination of the heat-resistant polymeric material and the additive in a given proportion is dissolved in a solvent (usually, an organic solvent) and this solution is formed into a given shape (e.g., a sheet or film form). Thereafter, the solvent is removed by drying to thereby insolubilize the additive contained in the polymeric material. Thus, a polymer composition can be obtained which has a micro-domain structure comprising a continuous phase made of the polymer and, dispersed therein, a discontinuous phase made of the additive having an average diameter smaller than 10 $\mu$m. The temperature for the drying is generally 60° C. or higher (e.g., about 60 to 250° C.), although it varies depending on the kind of the solvent used.

A suitable addition amount of the additive can be selected according to a combination of the additive and the polymer. However, in order to form a porous article having a cell size smaller than 10 $\mu$m. the addition amount thereof is generally 200 parts by weight or smaller, preferably 100 parts by weight or smaller, per 100 parts by weight of the polymer. From the standpoint of attaining a porosity which enables the porous article to have a dielectric constant of 3 or lower, the additive is preferably incorporated in an amount of 10 parts by weight or larger per 100 parts by weight of the polymer.

From the polymer composition having a micro-domain structure, the ingredient constituting the discontinuous phase, i.e., the additive, is removed by a combination of at least one operation selected from vaporization and decomposition and an extraction operation while utilizing differences between the additive and the polymer in volatility (boiling point) or thermal decomposability and in solubility in a solvent. As a result, extremely fine cells are formed in the polymer.

The vaporization and decomposition are usually conducted by heating. Although a suitable temperature for the heating can be selected according to the boiling point and decomposition temperature of the additive, etc., a temperature of 100° C. or higher (e.g., about 100 to 500° C., preferably about 250 to 450° C.) is generally used. The vaporization/decomposition operation is frequently conducted at reduced pressure (e.g., 1 mmHg or lower) in order to increase the efficiency of removal of the additive. In the case where a polyimide precursor was used as the polymer constituting the continuous phase of the polymer composition, the precursor can be thermally converted to a polyimide simultaneously with this vaporization or decomposition operation.

The solvent for use in extracting the additive can be suitably selected according to the kind of the polymeric material constituting the continuous phase (matrix) of the polymer composition and the kind of the additive constituting the discontinuous phase thereof. Although general organic solvents can be used, especially preferred solvents are liquefied carbon dioxide and supercritical carbon dioxide.

In the present invention, vaporization or decomposition is conducted in combination with an extraction operation. Consequently, residue of the additive which cannot be removed by one of these operations can be completely removed by the other operation, whereby a porous article having an extremely low dielectric constant can be obtained. The vaporization or decomposition operation and the extraction operation can be conducted in any order. Namely, the vaporization or decomposition operation maybe conducted first, followed by the extraction operation. Alternatively, the extraction operation may be conducted first, followed by the vaporization or decomposition operation.

By the process described above, a heat-resistant porous article can be produced which has a cell size as small as, e.g., below 10 $\mu$m and a dielectric constant of, e.g., 3 or lower. In particular, it is possible to obtain a heat-resistant porous article having an average cell diameter smaller than 5 $\mu$m (e.g., about 0.1 to 5 $\mu$m, preferably about 0.1 to 3 $\mu$m) and a dielectric constant of 3 or lower (e.g., about 1.5 to 3), which has not been obtained by any conventional process. This porous article is extremely advantageously utilizable as, e.g., an internal insulator, buffering material, or circuit substrate in electronic appliances, etc., while taking advantage of excellent properties possessed by the heat-resistant polymer, such as heat resistance and mechanical properties.

According to the process for producing a porous article of the invention, a polymer composition having a specific micro-domain structure is treated with a combination of a vaporization or decomposition operation and an extraction operation to thereby remove the ingredient constituting the discontinuous phase. Consequently, a heat-resistant porous article having a finely cellular structure and a low dielectric constant can be easily produced efficiently. Because of its considerably small cell size and low dielectric constant, the porous article of the invention is extremely useful, e.g., as an internal insulator, buffering material, or circuit substrate in electronic appliances.

The present invention will be explained below in more detail by reference to the following Examples, but the invention should not be construed as being limited to those Examples in any way.

Each porous sheet (film) was examined for internal structure and dielectric constant by the following methods.

Internal Structure Examination of Sheet

A porous film produced was frozen in liquid nitrogen and broken. The resulting section was examined with a scanning electron microscope (SEM) (Hitachi S-570) at an accelerating voltage of 10 kV.

Determination of Dielectric Constant

The dielectric constant was determined with HP 4284A Precision LCR Meter, manufactured by Yokogawa-Hewlett-Packard, Ltd.

Synthesis Example 1

Synthesis of Polyimide Precursor [BPDA/PDA]

27 g of p-phenylenediamine (PDA) was introduced into a 500 ml separable flask equipped with a stirrer and a thermometer. 392 g of N-methyl-2-pyrrolidone (NMP) was added to the flask. The contents were stirred to dissolve the PDA. Subsequently, 73.5 g of 3,3',4,4'-biphenyltetracarboxylic dianhydride (BPDA) was gradually introduced into the vessel. The resulting mixture was then stirred continuously for 2 hours at a temperature of 30° C. or lower to obtain a polyimide resin precursor solution having a concentration of 20% by weight. This polyimide resin precursor solution had an intrinsic viscosity (measured at a concentration of 0.5 g/100 ml in NMP at 30° C.) of 1.5 and a solution viscosity at 30° C. of 800 Pa·s.

Synthesis Example 2
Synthesis of Polyimide Precursor [BPDA/FDA/PDA]

57.9 g (5.5 mol) of 3,3',4,4'-biphenyltetracarboxylic dianhydride (diphthalic dianhydride; BPDA) and 15.8 g (1.0 mol) of 2,2-bis(3,4-dicarboxyphenyl)hexafluoropropane dianhydride (6FDA) (total amount of the acid anhydrides: 6.5 mol) were dissolved in 395 g of N-methyl-2-pyrrolidone (NMP). The resulting mixture was continuously stirred for 2 hours at a temperature of 30° C. or lower to obtain a polyimide resin precursor solution having a concentration of 20%. This polyimide resin precursor solution had an intrinsic viscosity (measured at a concentration of 0.5 g/100 ml in NMP at 30° C.) of 1.7 and a solution viscosity at 30° C. of 820 Pa·s.

EXAMPLE 1

A urethane acrylate oligomer having a weight average molecular weight of 1,100 was added to the polyimide resin precursor solution obtained in Synthesis Example 1, in an amount of 38 parts by weight per 100 parts by weight of the polyimide resin precursor. The resulting mixture was stirred to obtain a transparent homogeneous solution. This solution was applied to a 25 μm-thick stainless-steel foil (SUS304) with a spin coater in such an amount as to result in a polyimide resin precursor film having a thickness of 15 μm on a dry basis. The coating was dried in a circulating hot-air oven first at 90° C. for 15 minutes and then at 180° C. for 10 minutes to remove the solvent. Thus, a polyimide resin precursor film was obtained which had a micro-domain structure containing the urethane acrylate oligomer. The urethane acrylate oligomer domains (discontinuous phase) had an average diameter of 2.3 μm.

The urethane acrylate oligomer was removed by heating the film at 350° C. in a vacuum of 0.01 Torr to produce a porous polyimide film. This polyimide film was cut into a circular sheet having a diameter of 80 mm. The circular sheet was placed in a 500 cc pressure vessel, and the pressure inside the vessel was elevated to 25 MPa in a 40° C. atmosphere. $CO_2$ was injected into and discharged from the vessel at a flow rate of about 3 liters/min in terms of gas amount while maintaining the pressure. This operation for extracting the polyurethane acrylate oligomer was conducted for 2 hours. An SEM image of a section of the porous film obtained was processed to determine the cell size, which was found to be 2 μm. The porous film had a dielectric constant $\in$ of 2.88 (1 MHz).

EXAMPLE 2

A urethane acrylate oligomer having a weight average molecular weight of 1,100 was added to the polyimide resin precursor solution obtained in Synthesis Example 1, in an amount of 38 parts by weight per 100 parts by weight of the polyimide resin precursor. The resulting mixture was stirred to obtain a transparent homogeneous solution. This solution was applied to a 25 μm-thick stainless-steel foil (SUS304) with a spin coater in such an amount as to result in a polyimide resin precursor film having a thickness of 15 μm on a dry basis. The coating was dried in a circulating hot-air oven first at 90° C. for 15 minutes and then at 180° C. for 10 minutes to remove the solvent. Thus, a polyimide resin precursor film was obtained which had a micro-domain structure containing the urethane acrylate oligomer. The urethane acrylate oligomer domains (discontinuous phase) had an average diameter of 2.3 μm.

This polyimide resin precursor film was cut into a circular sheet having a diameter of 80 mm. The circular sheet was placed in a 500 cc pressure vessel, and the pressure inside the vessel was elevated to 25 MPa in a 40° C. atmosphere. $CO_2$ was injected into and discharged from the vessel at a flow rate of about 3 liters/mm in terms of gas amount while maintaining the pressure. This operation for extracting the polyurethane acrylate oligomer was conducted for 2 hours. The sheet was heated at 350° C. in a vacuum of 0.01 Torr to produce a porous polyimide film. An SEM image of a section of the porous film obtained was processed to determine the cell size, which was found to be 2.5 μm. The porous film had a dielectric constant $\in$ of 2.75 (1 MHz).

EXAMPLE 3

A polyethylene glycol diacrylate oligomer having a weight average molecular weight of 500 was added to the polyimide resin precursor solution obtained in Synthesis Example 1, in an amount of 38 parts by weight per 100 parts by weight of the polyimide resin precursor. The resulting mixture was stirred to obtain a transparent homogeneous solution. This solution was applied to a 25 μm-thick stainless-steel foil (SUS304) with a spin coater in such an amount as to result in a polyimide resin precursor film having a thickness of 15 μm on a dry basis. The coating was dried in a circulating hot-air oven first at 90° C. for 15 minutes and then at 180° C. for 10 minutes to remove the solvent. Thus, a polyimide resin precursor film was obtained which had a micro-domain structure containing the polyethylene glycol diacrylate oligomer. The polyethylene glycol diacrylate oligomer domains (discontinuous phase) had an average diameter of 0.4 μm.

This polyimide resin precursor film was cut into a circular sheet having a diameter of 80 mm. The circular sheet was placed in a 500-cc pressure vessel, and the pressure inside the vessel was elevated to 25 MPa in a 40° C. atmosphere. $CO_2$ was injected into and discharged from the vessel at a flow rate of about 3 liters/min in terms of gas amount while maintaining the pressure. This operation for extracting and removing the polyethylene glycol diacrylate oligomer was conducted for 2 hours. The sheet was heated at 350° C. in a vacuum of 0.01 Torr to produce a porous polyimide film. An SEM image of a section of the porous film obtained was processed to determine the cell size, which was found to be 0.8 μm. The porous film had a dielectric constant $\in$ of 2.75 (1 MHz).

EXAMPLE 4

A polyethylene glycol diacrylate oligomer having a weight average molecular weight of 500 was added to the polyimide resin precursor solution obtained in Synthesis Example 1, in an amount of 66 parts by weight per 100 parts by weight of the polyimide resin precursor. The resulting mixture was stirred to obtain a transparent homogeneous solution. This solution was applied to a 25 μm-thick stainless-steel foil (SUS304) with a spin coater in such an amount as to result in a polyimide resin precursor film having a thickness of 15 μm on a dry basis. The coating was dried in a circulating hot-air oven first at 90° C. for 15 minutes and then at 180° C. for 10 minutes to remove the solvent. Thus, a polyimide resin precursor film was obtained which had a micro-domain structure containing the polyethylene glycol diacrylate oligomer. The polyethylene glycol diacrylate oligomer domains (discontinuous phase) had an average diameter of 0.8 μm.

This polyimide resin precursor film was cut into a circular sheet having a diameter of 80 mm. The circular sheet was placed in a 500-cc pressure vessel, and the pressure inside the vessel was elevated to 25 MPa in a 40° C. atmosphere. $CO_2$ was injected into and discharged from the vessel at a flow rate of about 3 liters/min in terms of gas amount while maintaining the pressure. This operation for extracting and removing the polyethylene glycol diacrylate oligomer was conducted for 2 hours. The sheet was heated at 350° C. in a vacuum of 0.01 Torr to produce a porous polyimide film. An SEM image of a section of the porous film obtained was processed to determine the cell size, which was found to be 1.0 µm. The porous film had a dielectric constant ∈ of 2.24 (1 MHz).

EXAMPLE 5

A polyethylene glycol diacrylate oligomer having a weight average molecular weight of 500 was added to the polyimide resin precursor solution obtained in Synthesis Example 2, in an amount of 20 parts by weight per 100 parts by weight of the polyimide resin precursor. The resulting mixture was stirred to obtain a transparent homogeneous solution. This solution was applied to a 25 µm-thick stainless-steel foil (SUS304) with a spin coater in such an amount as to result in a polyimide resin precursor film having a thickness of 15 µm on a dry basis. The coating was dried in a circulating hot-air oven first at 90° C. for 15 minutes and then at 180° C. for 10 minutes to remove the solvent. Thus, a polyimide resin precursor film was obtained which had a micro-domain structure containing the polyethylene glycol diacrylate oligomer. The polyethylene glycol diacrylate oligomer domains (discontinuous phase) had an average diameter of 0.5 µm.

This polyimide resin precursor film was cut into a circular sheet having a diameter of 80 mm. The circular sheet was placed in a 500-cc pressure vessel, and the pressure inside the vessel was elevated to 25 MPa in a 40° C. atmosphere. $CO_2$ was injected into and discharged from the vessel at a flow rate of about 3 liters/min in terms of gas amount while maintaining the pressure. This operation for extracting and removing the polyethylene glycol diacrylate oligomer was conducted for 2 hours. The sheet was heated at 400° C. in a vacuum of 0.01 Torr to produce a porous polyimide film. An SEM image of a section of the porous film obtained was processed to determine the cell size, which was found to be 0.5 µm. The porous film had a dielectric constant ∈ of 2.98 (1 MHz).

Comparative Example 1

The polyimide resin precursor solution obtained in Synthesis Example 1 was applied to a 25 µm-thick stainless-steel foil (SUS304) with a spin coater in such an amount as to result in a polyimide resin precursor film having a thickness of 15 µm on a dry basis. The coating was dried in a circulating hot-air oven first at 90° C. for 15 minutes and then at 180° C. for 10 minutes to remove the solvent. Thus, a polyimide resin precursor film was obtained. The precursor film was heated at 350° C. in a vacuum of 0.01 Torr to produce a polyimide film. A section of the film obtained was examined with the SEM, but no cells were observed. This film had a dielectric constant ∈ of 3.17 (1 MHz).

Comparative Example 2

The polyimide resin precursor solution obtained in Synthesis Example 1 was applied to a 25 µm-thick stainless-steel foil (SUS304) with a spin coater in such an amount as to result in a polyimide resin precursor film having a thickness of 15 µm on a dry basis. The coating was dried in a circulating hot-air oven first at 90° C. for 15 minutes and then at 180° C. for 10 minutes to remove the solvent. Thus, a polyimide resin precursor film was obtained. This polyimide resin precursor film was cut into a circular sheet having a diameter of 80 mm. The circular sheet was placed in a 500-cc pressure vessel, and the pressure inside the vessel was elevated to 25 MPa in a 40° C. atmosphere. $CO_2$ was injected into and discharged from the vessel at a flow rate of about 3 liters/min in terms of gas amount while maintaining the pressure. This operation was conducted for 2 hours. The sheet was heated at 350° C. in a vacuum of 0.01 Torr to produce a polyimide film. A section of the film obtained was examined with the SEM, but no cells were observed. This film had a dielectric constant ∈ of 3.20 (1 MHz)

As apparent from the above, the porous article films made of a heat-resistant polymer which were obtained in the Examples each was a film having a finely cellular structure wherein the cells had a size as small as below 10 µm and having a low dielectric constant.

What is claimed is:

1. A process for producing a porous article which comprises subjecting a polymer composition having a micro-domain structure comprising a continuous polymer phase and dispersed therein a discontinuous phase having an average diameter smaller than 10 µm and a weight average molecular weight of about 200 to 10,000 to a treatment for removing an ingredient constituting the discontinuous phase by a process comprising at least one operation selected from vaporization and/or decomposition, said process further comprising an extraction operation to thereby make the polymer porous.

2. The process for producing a porous article as claimed in claim 1, wherein liquefied carbon dioxide or supercritical carbon dioxide is used as an extraction solvent for the ingredient constituting the discontinuous phase.

3. The process for producing a porous article as claimed in claim 1, wherein the weight average molecular weight is from about 200 to 3,000.

\* \* \* \* \*